(12) United States Patent
Kim et al.

(10) Patent No.: US 11,205,761 B2
(45) Date of Patent: Dec. 21, 2021

(54) LIGHT EMITTING DEVICE AND DISPLAY DEVICE INCLUDING THE SAME

(71) Applicant: SAMSUNG ELECTRONICS CO., LTD., Suwon-si (KR)

(72) Inventors: Kwanghee Kim, Seoul (KR); Dae Young Chung, Suwon-si (KR); Tae Hyung Kim, Seoul (KR); Eun Joo Jang, Suwon-si (KR); Moon Gyu Han, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 82 days.

(21) Appl. No.: 16/832,004

(22) Filed: Mar. 27, 2020

(65) Prior Publication Data
US 2020/0313106 A1 Oct. 1, 2020

(30) Foreign Application Priority Data
Mar. 29, 2019 (KR) ........................ 10-2019-0037304

(51) Int. Cl.
*H01L 51/50* (2006.01)
*H01L 51/56* (2006.01)
*H01L 51/00* (2006.01)

(52) U.S. Cl.
CPC .......... *H01L 51/502* (2013.01); *H01L 51/005* (2013.01); *H01L 51/5004* (2013.01);
(Continued)

(58) Field of Classification Search
CPC ... H01L 51/502; H01L 51/5004; H01L 51/56; H01L 51/005; H01L 2251/30;
(Continued)

(56) References Cited

U.S. PATENT DOCUMENTS 8,330,142 B2 12/2012 Cho et al.
9,318,632 B2 4/2016 Lewis et al.
(Continued)

FOREIGN PATENT DOCUMENTS

KR 101140309 B1 5/2012
KR 20160086603 A 7/2016
(Continued)

OTHER PUBLICATIONS

Aqiang Wang et al., "Bright, Efficient, and Color-stable Violet ZnSe-Based Quantum Dots Light-Emitting Diodes," Nanoscale, Jan. 5, 2015, pp. 2951-2959, vol. 7.
(Continued)

*Primary Examiner* — Yasser A Abdelaziez
(74) *Attorney, Agent, or Firm* — Cantor Colburn LLP

(57) ABSTRACT

An electroluminescent device including a first electrode and a second electrode facing each other, and a quantum dot emission layer disposed between the first electrode and the second electrode and a method of manufacturing the same. The quantum dot emission layer does not include cadmium and lead, the quantum dot emission layer includes a first layer including first quantum dots, facing the first electrode, a second layer including second quantum dots, facing the second electrode, and a third layer including third quantum dots, disposed between the first layer and the second layer, wherein a highest occupied molecular orbital energy level of the third layer is less than a highest occupied molecular orbital energy level of the layer and the highest occupied molecular orbital energy level of the third layer is less than a highest occupied molecular orbital energy level of the second layer.

20 Claims, 3 Drawing Sheets

(52) U.S. Cl.
CPC ........ *H01L 51/56* (2013.01); *H01L 2251/301* (2013.01); *H01L 2251/552* (2013.01)

(58) Field of Classification Search
CPC ......... H01L 2251/301; H01L 2251/552; H01L 51/0037; H01L 51/0043; H01L 51/0039; H01L 51/504; H01L 51/5024; H01L 2251/56; C09K 11/70; C09K 11/883; C09K 11/565; C09K 11/025; Y10S 977/774
See application file for complete search history.

(56) References Cited

U.S. PATENT DOCUMENTS

| | | | |
|---|---|---|---|
| 2006/0145168 A1* | 7/2006 | Yamazaki | H01L 51/5096 257/88 |
| 2010/0213438 A1* | 8/2010 | Cho | B82Y 30/00 257/13 |
| 2016/0225947 A1* | 8/2016 | Murayama | H01L 51/502 |
| 2017/0263878 A1* | 9/2017 | Seo | H01L 51/0052 |
| 2018/0101031 A1 | 4/2018 | Li et al. | |
| 2018/0148638 A1 | 5/2018 | Ahn et al. | |
| 2018/0151817 A1 | 5/2018 | Cho et al. | |

FOREIGN PATENT DOCUMENTS

| | | |
|---|---|---|
| KR | 101652789 B1 | 9/2016 |
| KR | 20180059363 A | 6/2018 |

OTHER PUBLICATIONS

Deniz Bozyigit et al., "Challenges and solutions for highefficiency quantum dot-based LEDs," M RS Bulletin, Sep. 2013, pp. 731-736, vol. 38.

Eunjoo Jang et al., "White-Light-Emitting Diodes with Quantum Dot Color Converters for Display Backlights," Advanced Materials, May 31, 2010, pp. 3076-3080, vol. 22.

Seth Coe et al., "Electroluminescence from single monolayers of nanocrystals in molecular organic devices," Nature, Dec. 2012, pp. 800-803, vol. 420.

Shuai Chang et al., "Alcohol-Soluble Quantum Dots: Enhanced Solution Processability and Charge Injection for Electroluminescence Devices," IEEE Journal of Selected Topics in Quantum Electronics, Sep./Oct. 2017, pp. 1900708-1~1900708-8, vol. 23, Issue 5.

Tae-Ho Kim et al., "Full-colour quantum dot displays fabricated by transfer printing," Nature Photonics, Mar. 2011, pp. 176-182, vol. 5.

Yasuhiro Shirasaki et al., "Emergence of colloidal quantum-dot light-emitting technologies," Nature Photonics, Jan. 2013, pp. 13-23. vol. 7.

* cited by examiner

LIGHT EMITTING DEVICE AND DISPLAY DEVICE INCLUDING THE SAME

CROSS-REFERENCE TO RELATED APPLICATION

This application claims priority to and the benefit of Korean Patent Application No. 10-2019-0037304 filed in the Korean Intellectual Property Office on Mar. 29, 2019, and all the benefits accruing therefrom under 35 U.S.C. § 119, the content of which in its entirety is herein incorporated by reference.

BACKGROUND

1. Field

A light emitting device and a display device are disclosed.

2. Description of the Related Art

Quantum dots, which are semiconductor nanocrystals, may have different energy bandgaps by controlling their sizes and compositions. Such quantum dots may emit light of various wavelengths. The quantum dots may be applied to, e.g., used in, various electronic devices including displays.

SUMMARY

An embodiment provides an electroluminescent device having a quantum dot emission layer of a multi-layer structure so as to realize improved electroluminescence properties and life-span characteristics.

An embodiment provides a method of manufacturing the electroluminescent device.

An embodiment provides a display device including the electroluminescent device.

An embodiment provides the aforementioned quantum dot emission layer of a multi-layer structure.

An electroluminescent device according to an embodiment includes a first electrode and a second electrode facing each other, a quantum dot emission layer disposed between the first electrode and the second electrode, wherein the quantum dot emission layer does not include cadmium, lead, or a combination thereof, the quantum dot emission layer includes a first layer including first quantum dots, the first layer facing the first electrode; a second layer including second quantum dots, the second layer facing the second electrode; and a third layer including third quantum dots, the third layer disposed between the first layer and the second layer, a highest occupied molecular orbital (HOMO) energy level of the third layer is less than a HOMO energy level of the first layer, and the HOMO energy level of the third layer is less than a HOMO energy level of the second layer.

The first layer and the third layer may be (e.g., directly) adjacent to each other. The third layer and the second layer may be (e.g., directly) adjacent to each other.

A difference between the HOMO energy level of the third layer and the HOMO energy level of the first layer may be greater than or equal to about 0.2 electronvolts (eV).

A difference between the HOMO energy level of the third layer and the HOMO energy level of the first layer may be greater than or equal to about 0.3 eV.

A difference between the HOMO energy level of the third layer and the HOMO energy level of the second layer may be greater than or equal to about 0.2 eV.

A difference between the HOMO energy level of the third layer and the HOMO energy level of the second layer may be greater than or equal to about 0.3 eV.

The first quantum dots, the second quantum dots, and the third quantum dots may have a same or different composition.

The first quantum dots, the second quantum dots, and the third quantum dots may include a Group II-VI compound, a Group III-V compound, or a combination thereof.

The first quantum dots, the second quantum dots, and the third quantum dots may be InP, InZnP, ZnSe, ZnSeTe, ZnSeS, ZnTeS, ZnS, or a combination thereof.

The first quantum dots, the second quantum dots, and the third quantum dots may each independently include a core including a first semiconductor nanocrystal and a shell disposed on the core and including a second semiconductor nanocrystal having a different composition from the first semiconductor nanocrystal.

The first semiconductor nanocrystal and the second semiconductor nanocrystal may each independently include a Group II-VI compound, a Group III-V compound, a Group IV-VI compound, a Group I-III-VI compound, Group I-II-IV-VI compound, or a combination thereof.

The first semiconductor nanocrystal may include indium, zinc, or a combination thereof. The first semiconductor nanocrystal may include InP, InZnP, ZnSe, ZnSeTe, or a combination thereof.

The second semiconductor nanocrystal may include zinc and selenium, sulfur, or a combination thereof. The second semiconductor nanocrystal may include ZnSe, ZnSeS, ZnTeS, ZnTeSe, ZnS, or a combination thereof.

The first quantum dots, the second quantum dots, and the third quantum dots may be configured to emit light having a same color.

The first quantum dots, the second quantum dots, and the third quantum dots may not include an organic thiol compound bound to a surface thereof.

The first quantum dots and the second quantum dots may include a halide and an organic ligand on a surface thereof. An amount of the organic ligand of the second quantum dots may be less than or equal to about 10 weight percent (wt %), based on a total weight of the second quantum dots. In the second quantum dots, an amount of the halogen may be greater than or equal to about 1 microgram (μg) and less than about 30 μg per 1 milligram (mg) of the quantum dots.

The third quantum dots may include an organic ligand on a surface thereof and may not include a halogen.

An amount (e.g., mole or weight) ratio of carbon relative to zinc present in the first layer may be less than a mole ratio of carbon relative to zinc present in the third layer, according to X-ray photoelectron spectroscopy (XPS). An amount (e.g., mole or weight) ratio of carbon relative to zinc present in the second layer may be less than a mole ratio of carbon relative to zinc present in the third layer, according to X-ray photoelectron spectroscopy (XPS).

An amount (e.g., mole or weight) of halogen present in the third layer may be less than an amount (e.g., mole or weight) of halogen present in the first layer and/or the second layer, according to by X-ray photoelectron spectroscopy (XPS).

The organic ligand may include RCOOH, RNH$_2$, R$_2$NH, R$_3$N, R$_3$PO, R$_3$P, ROH, RCOOR, RPO(OH)$_2$, RHPOOH, R$_2$POOH, or a combination thereof, wherein each R is independently a C3 to C40 substituted or unsubstituted aliphatic hydrocarbon group, a C6 to C40 substituted or unsubstituted aromatic hydrocarbon group, or a combination thereof.

The organic ligand may include a C6 to C30 aliphatic carboxylic acid compound.

The halide may include chloride.

The halide may be a metal halide and may include zinc, indium, gallium, magnesium, lithium, or a combination thereof.

A thickness of the first layer may be greater than or equal to about 5 nanometers (nm), a thickness of the second layer may be greater than or equal to about 5 nm, a thickness of the third layer may be greater than or equal to about 5 nm, or a combination thereof.

A thickness of the first layer may be less than or equal to about 40 nm, a thickness of the second layer may be less than or equal to about 40 nm, a thickness of the third layer may be less than or equal to about 40 nm, or a combination thereof.

A thickness of the quantum dot emission layer may be greater than or equal to about 15 nm.

A thickness of the quantum dot emission layer may be less than or equal to about 30 nm.

A thickness of the quantum dot emission layer may be less than or equal to about 100 nm.

The electroluminescent device may further include first charge auxiliary layer adjacent to the first layer, a second charge auxiliary layer adjacent to the second layer, or a combination thereof.

The first charge auxiliary layer may include a hole transport layer, a hole injection layer, or both of them.

The second charge auxiliary layer may include a nanoparticle including a zinc metal oxide.

The zinc metal oxide may be represented by Chemical Formula 1:

$$Zn_{1-x}M_xO$$ <span>Chemical Formula 1</span>

In Chemical Formula 1,

M is Mg, Ca, Zr, W, Li, Ti, Y, Al, or a combination thereof, and $0 \leq x \leq 0.5$.

The metal oxide may include zinc oxide, zinc magnesium oxide, or a combination thereof.

An average particle size of the nanoparticles may be greater than or equal to about 1 nm.

An average particle size of the nanoparticles may be less than or equal to about 10 nm.

The electroluminescent device may further include a polymer layer on the second electrode. The polymer layer may encapsulate the entire electroluminescent device.

The electroluminescent device may emit blue light. The electroluminescent device may exhibit a peak external quantum efficiency (EQE) of greater than or equal to about 10%. The electroluminescent device may exhibit a maximum luminance of greater than or equal to about 20,000 candelas per square meter ($cd/m^2$). The electroluminescent device may exhibit a T95 of greater than or equal to about 3 hours at a light dose of 100 nits (candelas per square meter).

A method of manufacturing an electroluminescent device according to an embodiment includes forming an emission layer on a first electrode; and forming a second electrode on the emission layer, wherein the forming of the emission layer includes forming a first layer including first quantum dots on the first electrode, forming a third layer including third quantum dots on the first layer, and forming a second layer including second quantum dots on the third layer, wherein a HOMO energy level of the third layer is less than a HOMO energy level of the first layer and the HOMO energy level of the third layer is less than a HOMO energy level of the second layer.

The method may further include forming a charge auxiliary layer (e.g., a hole injection layer, a hole transport layer, or a combination thereof) before forming the emission layer on the first electrode. The method may further include forming a charge auxiliary layer (e.g., an electron transport layer, an electron injection layer, or a combination thereof) on the emission layer before forming the second electrode.

The forming of the first layer may include obtaining the first quantum dots by surface-treating quantum dots having organic ligands on a surface thereof with a metal halide.

The forming of the second layer on the third layer may include obtaining the second quantum dots by surface-treating quantum dots having organic ligands on a surface thereof with a metal halide.

An embodiment provides a display device including the aforementioned electroluminescent device.

In an embodiment, the emission layer may include a first layer including first quantum dots, a second layer including second quantum dots, and a third layer including third quantum dots and disposed between the first layer and the second layer, wherein an amount ratio of carbon relative to zinc in the third layer may be greater than an amount ratio of carbon relative to zinc in the first layer or the second layer and an amount ratio of a halogen relative to zinc in the third layer is less than an amount ratio of a halogen relative to zinc in the first layer or the second layer. The amount ratio may be a molar ratio or an atomic percent.

A HOMO energy level of the third layer may be lower than a HOMO energy level of the first layer and a HOMO energy level of the second layer.

According to an embodiment, an electroluminescent device having an extended life-span while exhibiting improved electroluminescence properties may be provided.

DETAILED DESCRIPTION

Figure 1:
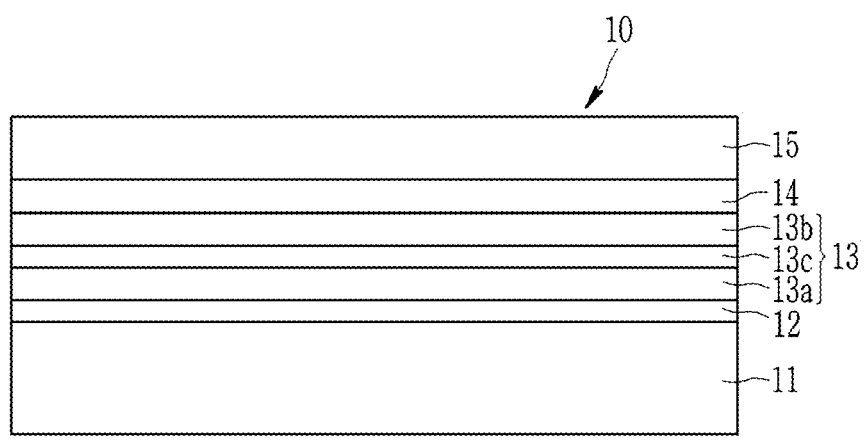
FIG. 1 is a schematic cross-sectional view of a quantum dot (QD) light emitting diode (LED) device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function or a (HOMO or lowest unoccupied molecular orbital (LUMO)) energy level is expressed as an absolute value from a vacuum level. In addition, when the work function or the energy level is referred to be "deep," "high" or "large," the work function or the energy level has a large absolute value based on "0 eV" of the vacuum level, while when the work function or the energy level is referred to be "shallow," "low," or "small," the work function or the energy level has a small absolute value based on "0 eV" of the vacuum level.

As used herein, when a definition is not otherwise provided, "Group" may refer to a group of Periodic Table.

As used herein, when a definition is not otherwise provided, "Group I" refers to Group IA and Group IB, and examples may include Li, Na, K, Rb, and Cs, but are not limited thereto.

As used herein, when a definition is not otherwise provided, "Group II" refers to Group IIA and Group IIB, and examples of Group II metal may be Cd, Zn, Hg, and Mg, but are not limited thereto.

As used herein, when a definition is not otherwise provided, "Group III" refers to Group IIIA and Group IIIB, and examples of Group III metal may be Al, In, Ga, and Tl, but are not limited thereto.

As used herein, when a definition is not otherwise provided, "Group IV" refers to Group IVA and Group IVB, and examples of a Group IV metal may be Si, Ge, and Sn, but are not limited thereto. As used herein, "metal" may include a semi-metal such as Si.

As used herein, when a definition is not otherwise provided, "Group V" refers to Group VA, and examples may include nitrogen, phosphorus, arsenic, antimony, and bismuth, but are not limited thereto.

As used herein, when a definition is not otherwise provided, "Group VI" refers to Group VIA, and examples may include sulfur, selenium, and tellurium, but are not limited thereto.

As used herein, when a definition is not otherwise provided, "substituted" refers to replacement of hydrogen in a compound, a group, or a moiety by a substituent of a C1 to C30 alkyl group, a C2 to C30 alkenyl group, a C2 to C30 alkynyl group, a C2 to C30 epoxy group, a C2 to C30 alkenyl group, a C2 to C30 alkylester group, a C3 to C30 alkenylester group (e.g., acrylate group, methacrylate group), a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br or —I), a hydroxy group (—OH), a nitro group (—NO$_2$), a cyano group (—CN), an amino group (—NRR', wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, a "hydrocarbon group" may refer to a group including carbon and hydrogen (e.g., alkyl, alkenyl, alkynyl, aryl group, etc.). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

As used herein, when a definition is not otherwise provided, "alkyl" may refer to a linear or branched saturated monovalent hydrocarbon group (methyl, ethyl hexyl, etc.).

As used herein, when a definition is not otherwise provided, "alkenyl" may refer to a linear or branched monovalent hydrocarbon group having one or more carbon-carbon double bond.

As used herein, when a definition is not otherwise provided, "alkynyl" may refer to a linear or branched monovalent hydrocarbon group having one or more carbon-carbon triple bond.

As used herein, when a definition is not otherwise provided, "aryl" may refer to a group formed by removal of at least one hydrogen from an aromatic group (e.g., phenyl or naphthyl group).

As used herein, when a definition is not otherwise provided, "hetero" may refer to one including 1 to 3 heteroatoms of N, O, S, Si, P, or a combination thereof.

As used herein, when a definition is not otherwise provided, "monovalent hydrocarbon group" may refer to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, "alkylene group" may refer to a straight or branched saturated aliphatic hydrocarbon group having at least two valences and optionally substituted with at least one substituent.

As used herein, "arylene group" may refer to a functional group having at least two valences obtained by removal of at least two hydrogens in at least one aromatic ring, and optionally substituted with at least one substituent.

As used herein, when a definition is not otherwise provided, "aliphatic" may refer to a C1 to C30 linear or branched alkyl group, a C2 to C30 linear or branched alkenyl group, or a C2 to C30 linear or branched alkynyl group.

As used herein, when a definition is not otherwise provided, "aromatic" may refer to a C6 to C30 aryl group or a C2 to C30 heteroaryl group.

As used herein, when a definition is not otherwise provided, "alicyclic" may refer to a C3 to C30 cycloalkyl group, a C3 to C30 cycloalkenyl group, or a C3 to C30 cycloalkynyl group.

As used herein, when a definition is not otherwise provided, "(meth)acrylate" may refer to acrylate, methacrylate, or a combination thereof. The (meth)acrylate may include a (C1 to C10 alkyl)acrylate, a (C1 to C10 alkyl)methacrylate, or a combination thereof.

As used herein, when a definition is not otherwise provided, "alkoxy" may refer to alkyl group that is linked via an oxygen (i.e., alkyl-O—), for example methoxy, ethoxy, and sec-butyloxy groups.

As used herein, when a definition is not otherwise provided, "amine" may refer to a group having the general formula —NRR, wherein each R is independently hydrogen, a C1-C12 alkyl group, a C7-C20 alkylarylene group, a C7-C20 arylalkylene group, or a C6-C18 aryl group.

As used herein, when a definition is not otherwise provided, "arene" may refer to a hydrocarbon having an aromatic ring, and includes monocyclic and polycyclic hydrocarbons wherein the additional ring(s) of the polycyclic hydrocarbon may be aromatic or nonaromatic. Specific arenes include benzene, naphthalene, toluene, and xylene.

As used herein, when a definition is not otherwise provided, "arylalkyl" may refer to a substituted or unsubstituted aryl group covalently linked to an alkyl group that is linked to a compound (e.g., a benzyl is a C7 arylalkyl group).

As used herein, when a definition is not otherwise provided, "cycloalkenyl" may refer to a monovalent hydrocarbon group having one or more rings and one or more carbon-carbon double bond in the ring, wherein all ring members are carbon (e.g., cyclopentyl and cyclohexyl).

As used herein, when a definition is not otherwise provided, "cycloalkyl" may refer to a monovalent hydrocarbon group having one or more saturated rings in which all ring members are carbon (e.g., cyclopentyl and cyclohexyl).

As used herein, when a definition is not otherwise provided, "cycloalkynyl" may refer to a stable aliphatic monocyclic or polycyclic group having at least one carbon-carbon triple bond, wherein all ring members are carbon (e.g., cyclohexynyl).

As used herein, when a definition is not otherwise provided, "ester" may refer to a group of the formula —O(C=O)Rx or a group of the formula —(C=O)ORx wherein Rx is C1 to C28 aromatic organic group or aliphatic organic group. An ester group includes a C2 to C30 ester group, and specifically a C2 to C18 ester group.

As used herein, when a definition is not otherwise provided, "heteroalkyl" may refer to alkyl group that comprises at least one heteroatom covalently bonded to one or more carbon atoms of the alkyl group. Each heteroatom is independently chosen from nitrogen (N), oxygen (O), sulfur (S), and or phosphorus (P). FIG. 1 is a schematic cross-sectional view of a light emitting device according to an embodiment.

Referring to FIG. 1, a light emitting device 10 according to an embodiment includes a first electrode 11 and a second electrode 15 facing each other, and a quantum dot emission layer 13 (including a plurality of quantum dots) disposed between the first electrode 11 and the second electrode 15. The quantum dot emission layer 13 may not include cadmium, lead, or a combination thereof. The quantum dot emission layer includes a first layer 13a including first quantum dots, facing the first electrode, and having a first HOMO energy level (e.g., a HOMO energy level of the first layer), a second layer 13b including second quantum dots, facing the second electrode, and having a second HOMO energy level (e.g., a HOMO energy level of the second layer), and a third layer 13c including third quantum dots, disposed between the first layer and the second layer, and having a third HOMO energy level (e.g., a HOMO energy level of the third layer). The third HOMO energy level is less than the first HOMO energy level. The third HOMO energy level is less than the second HOMO energy level.

The electroluminescent device may further include a charge auxiliary layer disposed between the emission layer and the second electrode. The charge auxiliary layer may include a hole auxiliary layer 12 between the first electrode 11 and the emission layer 13 or an electron auxiliary layer 14 between the second electrode 15 and the emission layer 13.

The light emitting device may further include a substrate (not shown). The substrate may be disposed at the side of the first electrode 11 (e.g., anode) or the second electrode 15 (e.g., cathode). In an embodiment, the substrate may be disposed at the side of the first electrode. The substrate may be a substrate including an insulation material (e.g., insulating transparent substrate). The substrate may include glass; various polymers such as polyester (e.g., polyethylene terephthalate (PET), polyethylene naphthalate (PEN)), polycarbonate, polyacrylate, polyimide, and polyamideimide; polysiloxane (e.g., PDMS); inorganic materials such as $Al_2O_3$ and ZnO; or a combination thereof, but is not limited thereto. The substrate may be made of a silicon wafer, and the like. Herein "transparent" may refer to transmittance for light in a predetermined wavelength (e.g., light emitted from the quantum dots) of greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected taking into consideration a substrate material, and the like, but is not particularly limited. The transparent substrate may have flexibility. The substrate may be omitted.

One of the first electrode 11 and the second electrode 15 may be an anode and the other may be a cathode. In an embodiment, the first electrode 11 may be an anode, and the second electrode 15 may be a cathode. For another example, the first electrode 11 may be a cathode and the second electrode 15 may be an anode.

The first electrode 11 may be made of a conductor, for example a metal, a conductive metal oxide, or a combination thereof. The first electrode 11 may be for example made of a metal, such as nickel, platinum, vanadium, chromium, copper, zinc, and gold, or an alloy thereof; a conductive metal oxide, such as zinc oxide, indium oxide, tin oxide, indium tin oxide (ITO), indium zinc oxide (IZO), or fluorine doped tin oxide; or a combination of metal and oxide, such as ZnO and Al or $SnO_2$ and Sb; and the like, but is not limited thereto. In an embodiment, the first electrode may include a transparent conductive metal oxide, for example, indium tin oxide. The second electrode 15 may be made of a conductor, for example a metal, a conductive metal oxide, a conductive polymer, or a combination thereof. The second electrode 15 may be for example a metal, such as aluminum, magnesium, calcium, sodium, potassium, titanium, indium, yttrium, lithium, gadolinium, silver, gold, platinum, tin, lead, cesium, or barium, or an alloy thereof; a multi-layer structured material, such as LiF/Al, $Li_2O/Al$, Liq/Al, LiF/Ca, and $BaF_2/Ca$, but is not limited thereto. The conductive metal oxide is the same as described above. In an embodiment, the second electrode may include a transparent conductive metal oxide, for example, indium tin oxide.

A work function of the first electrode may be higher than a work function of the second electrode that will be described later. A work function of the first electrode may be lower than a work function of the second electrode that will be described later.

The first electrode 11, the second electrode 15, or a combination thereof may be a light-transmitting electrode, and the light-transmitting electrode may be for example made of a conductive oxide such as a zinc oxide, an indium oxide, a tin oxide, an indium tin oxide (ITO), an indium zinc oxide (IZO), or a fluorine doped tin oxide, or a metal thin layer of a single layer or a multilayer. When one of the first electrode 11 and the second electrode 15 is a non-light-transmitting electrode, it may be made of for example an opaque conductor such as aluminum (Al), silver (Ag), or gold (Au).

A thickness of the electrodes (a thickness of the first electrode, a thickness of the second electrode, or a thickness of each of the first electrode and the second electrode) is not particularly limited and may be appropriately selected taking into consideration device efficiency. In an embodiment, the thickness of the electrodes may be greater than or equal to about 5 nm, for example, greater than or equal to about 50 nm. In an embodiment, the thickness of the electrodes may be less than or equal to about 100 μm, for example, less than or equal to about 10 μm, less than or equal to about 1 μm, less than or equal to about 900 nm, less than or equal to about 500 nm, or less than or equal to about 100 nm.

The emission layer 13 includes a plurality of quantum dots. The quantum dots are nano-sized semiconductor nanocrystal particles and exhibit quantum confinement effects. The emission layer 13 has a multi-layer structure. In a quantum dot-based electroluminescent device, holes injected from a first electrode (e.g., an anode) and electrons injected from a second electrode (e.g., a cathode) in quantum dots of the emission layer make emission combinations and form excitons, from which light of a color adjusted depending on a size/a composition of the quantum dots is emitted. In order to inject/transport the electrons and the holes and to increase a change of combination of the electrons/the holes injected in the emission layer, a charge auxiliary layer such as an electron auxiliary layer, a hole auxiliary layer, and the like may be provided on both surfaces of the emission layer The charge auxiliary layer may prevent the holes and the electrons respectively from passing the emission layer and flowing toward an opposite electrode. In an embodiment, the electron auxiliary layer (e.g., an electron transport layer (ETL)) has a deep HOMO level and thus block the holes, and the hole auxiliary layer (e.g., a hole transport layer (HTL)) has a high LUMO level and thus blocks a flow of the electrons and accordingly, may increase an exciton generation in the emission layer. However, there may cause a problem of deteriorating the interface of the electron auxiliary layer (or the hole auxiliary layer) and the emission layer by inducing a light emission on the interface, quenching the quantum dots, and the like.

Unlike cadmium or lead-based quantum dots, cadmium-free or lead-free quantum dots may not exhibit desired luminous efficiency (e.g., peak external quantum efficiency or maximum luminance), particularly when applied to, e.g., used in, an electroluminescent device. In addition, without being bound by any particular theory, since cadmium-free and lead-free quantum dots have relatively poor stability, luminescence properties thereof may be affected by an external environment. Accordingly, as for an electroluminescent device including cadmium-free or lead-free quantum dots, the aforementioned interface degradation problem may become serious, possibly causing significantly adverse effect on a life-span of the device.

Luminous efficiency of an electroluminescent device may be improved by selecting one carrier of the electrons or the holes and increasing an injection thereof. When injection of the carrier is increased (e.g., excessively), an amount of the carrier injected may be increased (e.g., excessively) by a voltage change during the operation of the device, and interface bias of an emission region may become more significant, emissive recombinations (e.g., light emission) of the elections and the holes may mainly occur not in the middle of the emission layer but at the interface of the charge auxiliary layer and the emission layer, and such an interface light emission may result in deterioration of the whole device.

In the light emitting device according to an embodiment, the emission layer may have a sandwich shape including at least three layers whose energy levels are adjusted. In this stack-type emission layer, an interlayer may have a higher HOMO level than the other two adjacent layers (e.g., by greater than or equal to 0.3 eV). The present inventors have found that this sandwich type multi-layered emission layer may accomplish improved electroluminescence properties and simultaneously, contribute to addressing the aforementioned interface deterioration problem.

Accordingly, in a light emitting device according to an embodiment, the quantum dot emission layer 13 includes a first layer 13a including first quantum dots, facing the first electrode, and having a first HOMO energy level, a second layer 13b including second quantum dots, facing the second electrode, and having a second HOMO energy level, and a third layer 13c including third quantum dots, disposed between the first layer and the second layer, and having a third HOMO energy level. The first layer and the third layer may be adjacent to each other. The third layer and the second layer may be adjacent to each other. The major surface of the first layer and the major surface of the second layer may be contacted on opposite both surfaces of the third layer, respectively.

Figure 2A:
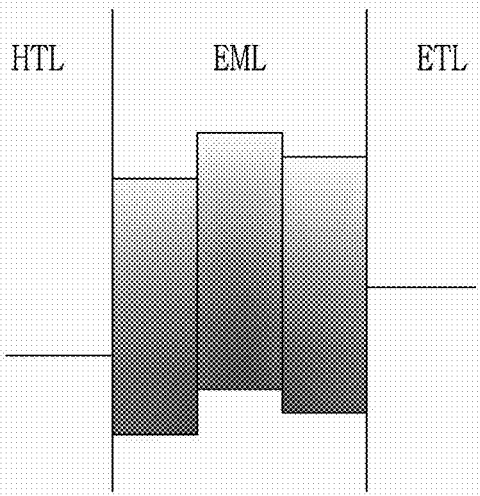
FIG. 2A is a schematic view of a band alignment of the emission layer in a QD LED device according to an embodiment.
Figure 2B:
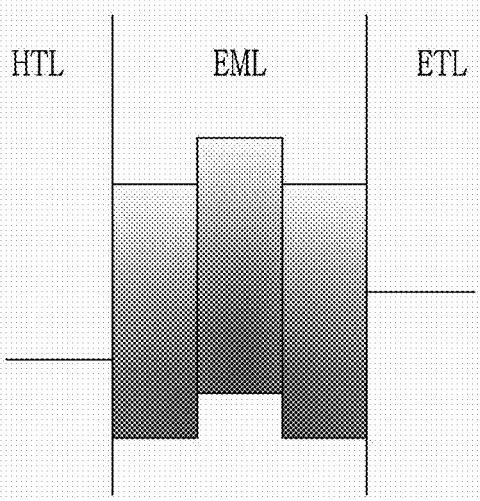
FIG. 2B is a schematic view of a band alignment of the emission layer in a QD LED device according to an embodiment.

FIG. 2A and referring to FIG. 2B, in the quantum dot emission layer (EML), the third HOMO energy level is less than the first HOMO energy level and the third HOMO energy level is less than the second HOMO energy level. Without wishing to be bound by any theory, the aforementioned band alignment may limit (confine) the holes injected from the anode to a center (middle) portion of the emission layer (e.g., the third emission layer) rather than interfacing with the emission layer, and interface bias in the light emitting area may be prevented (suppressed). In an embodiment, the first HOMO energy level may be greater than or equal to the second HOMO energy level. In an embodiment, the second HOMO energy level may be greater than the first HOMO energy level.

Referring to FIGS. 2A and 2B, in the quantum dot emission layer of the light emitting device according to an embodiment, the third LOMO energy level may be less than the first LOMO energy level. The third LOMO energy level may be less than the second LOMO energy level. In the quantum dot emission layer of a light emitting device according to an embodiment, the third LOMO energy level may be greater than the first LOMO energy level. The third LOMO energy level may be greater than the second LOMO energy level.

A difference between the third HOMO energy level and the first HOMO energy level may be greater than or equal to about 0.2 eV, greater than or equal to about 0.3 eV, greater than or equal to about 0.4 eV, or greater than or equal to about 0.5 eV; a difference between the third HOMO energy level and the second HOMO energy level may be greater than or equal to about 0.2 eV, greater than or equal to about 0.3 eV, greater than or equal to about 0.4 eV, or greater than or equal to about 0.5 eV; or a combination thereof.

A difference between the third LUMO energy level and the first LUMO energy level may be greater than or equal to about 0.1 eV, greater than or equal to about 0.2 eV, greater than or equal to about 0.3 eV, greater than or equal to about 0.4 eV, or greater than or equal to about 0.5 eV; a difference between the third LUMO energy level and the second LUMO energy level may be greater than or equal to about 0.1 eV, greater than or equal to about 0.2 eV, greater than or equal to about 0.3 eV, greater than or equal to about 0.4 eV, or greater than or equal to about 0.5 eV; or a combination thereof.

In the emission layer 13, the energy levels of the first layer, the second layer and the third layer may be selected taking into consideration the emitted color.

In an embodiment, when emitting blue light, the HOMO energy level of the first layer may be greater than or equal to about 5.4 eV (e.g., greater than or equal to about 5.5 eV) and less than or equal to about 6.1 eV (e.g., less than or equal to about 6.0 eV). The HOMO energy level of the second layer may be greater than or equal to about 5.6 eV (e.g., greater than or equal to about 5.7 eV) and less than or equal to about 6.1 eV (e.g., less than or equal to about 6.0 eV). The HOMO energy level of the third layer may be greater than or equal to about 5.3 eV and less than or equal to about 5.8 eV.

In an embodiment, when emitting red light, the HOMO energy level of the first layer may be greater than or equal to about 5.3 eV (e.g., greater than or equal to about 5.5 eV) and less than or equal to about 6 eV (e.g., less than or equal to about 6.0 eV). The HOMO energy level of the second layer may be greater than or equal to about 5.5 eV (e.g., greater than or equal to about 5.7 eV) and less than or equal to about 6 eV (e.g., less than or equal to about 6.0 eV). The HOMO energy level of the third layer may be greater than or equal to about 5.2 eV and less than or equal to about 5.7 eV. In an embodiment, when emitting green light, the HOMO energy level of the first layer may be greater than or equal to about 5.3 eV (e.g., greater than or equal to about 5.5 eV) and less than or equal to about 6 eV (e.g., less than or equal to about 6.0 eV). The HOMO energy level of the second layer may be greater than or equal to about 5.5 eV (e.g., greater than or equal to about 5.7 eV) and less than or equal to about 6 eV (e.g., less than or equal to about 6.0 eV). The HOMO energy level of the third layer may be greater than or equal to about 5.2 eV and less than or equal to about 5.7 eV.

In an embodiment, when emitting blue light, the LUMO energy level of the first layer may be greater than or equal to about 2.7 eV (e.g., greater than or equal to about 2.8 eV) and less than or equal to about 3.5 eV (e.g., less than or equal to about 3.4 eV). The LUMO energy level of the second layer may be greater than or equal to about 2.7 eV (e.g., greater than or equal to about 2.8 eV) and less than or equal to about 3.4 eV (e.g., less than or equal to about 3.3 eV). The LUMO energy level of the third layer may be greater than or equal to about 2.6 eV (e.g., greater than or equal to about 2.7 eV) and less than or equal to about 3.1 eV (e.g., less than or equal to about 3.0 eV).

In an embodiment, when emitting red light, the LUMO energy level of the first layer may be greater than or equal to about 3.5 eV (e.g., greater than or equal to about 3.6 eV) and less than or equal to about 4.2 eV. The LUMO energy level of the second layer may be greater than or equal to about 3.5 eV (e.g., greater than or equal to about 3.6 eV) and less than or equal to about 4.2 eV. The LUMO energy level of the third layer may be greater than or equal to about 3.4 eV and less than or equal to about 3.9 eV.

In an embodiment, when emitting green light, the LUMO energy level of the first layer may be greater than or equal to about 3 eV (e.g., greater than or equal to about 3.1 eV) and less than or equal to about 3.7 eV. The LUMO energy level of the second layer may be greater than or equal to about 3 eV (e.g., greater than or equal to about 3.2 eV) and less than or equal to about 3.7 eV. The LUMO energy level of the third layer may be greater than or equal to about 2.9 eV and less than or equal to about 3.4 eV.

The energy level arrangements between layers may be confirmed by appropriate means such as use of an AC-3 instrument or ultraviolet photoemission spectroscopy (UPS) analysis for the emission layer, but not limited thereto. In an embodiment, the emission layer having the aforementioned energy level arrangements may be obtained by adjusting the surface states (e.g., a gradient of an amount, e.g., concentration, of organic material or a gradient of a halide).

In the quantum dot emission layer of an embodiment, an amount of the organic ligand of the first layer may be less than an amount of the organic ligand of the third layer. In the quantum dot emission layer of an embodiment, the amount of the organic ligand of the second layer may be less than an amount of the organic ligand of the third layer. In the quantum dot emission layer of an embodiment, an amount of halogen (e.g., chlorine) present in the first layer may be greater than an amount of the halogen of the third layer. In the quantum dot emission layer of an embodiment, an amount of halogen present in the second layer may be greater than an amount of the halogen of the third layer. In the quantum dot emission layer of an embodiment, an amount of halogen present in the first layer may be greater than or equal to an amount of the halogen of the second layer. In the quantum dot emission layer of an embodiment, an amount of halogen present in the first layer may be less than or equal to an amount of the halogen of the second layer.

The amount of the organic ligand or amount of the halogen in the quantum dot emission layer may be confirmed by FT-IR, electron microscope energy dispersive spectroscopy (TEM-EDX), and XPS analysis of the emission layer (e.g., cross section of the emission layer), but is not limited thereto. As used herein, the "amount" may refer to a molar amount, a weight, or a combination thereof.

In a cross-section analysis of the quantum dot emission layer of an embodiment (e.g., TEM-EDX or XPS analysis), an amount (e.g., number of moles) of carbon present in the third layer may be greater than an amount (e.g., number of moles) of carbon present at or on one or both surfaces (e.g., outer surfaces) of the quantum dot emission layer (e.g., interface with the charge auxiliary layer).

In a cross-section analysis of the quantum dot emission layer of an embodiment, an amount (e.g., number of moles) of halogen present in the first layer may be greater than an amount (e.g., number of moles) of halogen present at or on one or both surfaces (e.g., outer surfaces) of the quantum dot emission layer (e.g., interface with the charge auxiliary layer).

The organic ligand may have a hydrophobic moiety. The organic ligand may include RCOOH, $RNH_2$, $R_2NH$, $R_3N$, $R_3PO$, $R_3P$, ROH, RCOOR, $RPO(OH)_2$, $RHPOOH$, $R_2POOH$, or a combination thereof, wherein each R is independently a C3 to C40 substituted or unsubstituted aliphatic hydrocarbon group, a C6 to C40 substituted or unsubstituted aromatic hydrocarbon group, or a combination thereof.

Examples of the organic ligand may be amines such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributyl amine, or trioctyl amine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, or trioctyl phosphine; a phosphine compound or an oxide compound thereof such as methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, or trioctyl phosphine oxide; a diphenyl phosphine, a triphenyl phosphine compound, or an oxide compound thereof; a C5 to C20 alkyl phosphonic acid; a C5 to C20 alkyl phosphonic acid such as hexyl phosphinic acid, octyl phosphinic acid, dodecane phosphinic acid, tetradecane phosphinic acid, hexadecane phosphinic acid, octadecane phosphinic acid; and the like, but are not limited thereto. The quantum dots may include one or more organic ligands.

The organic ligand may include a C6 to C30 aliphatic carboxylic acid compound, for example, oleic acid, myristic acid, stearic acid, or a combination thereof.

The halide may include a chloride. The halide may include a metal chloride. The metal chloride may include zinc chloride, indium chloride, or a combination thereof.

In an embodiment, an amount of the organic ligand of the first quantum dots (or the second quantum dots) may be less than 10 wt %, based on a total weight of the first quantum dots (or the second quantum dots). In the first quantum dots (or the second quantum dots), an amount of the halogen may be greater than or equal to about 1 microgram (μg) and less than about 30 μg per 1 milligram (mg) of the quantum dots.

Hereinafter, the first quantum dots, the second quantum dots, and the third quantum dots included in the emission layer are described in detail. Unless otherwise mentioned, the term, quantum dots are referred to as first quantum dots, second quantum dots, and/or third quantum dots.

The first quantum dots, the second quantum dots, and the third quantum dots may have the same or different composition. The quantum dots may include a Group III-V compound-based semiconductor nanocrystal including indium and phosphorus. The Group III-V compound may further include zinc. The quantum dots may include a semiconductor nanocrystal including a Group II-VI compound including a chalcogen element (e.g., sulfur, selenium, tellurium, or a combination thereof) and zinc. In an embodiment, the quantum dot does not include cadmium and lead, and may not include any other heavy metals (e.g., mercury). As used herein, not including cadmium, lead, or harmful heavy metals means that an amount of cadmium, lead, or harmful heavy metals is less than about 100 parts per million (ppm), less than about 50 ppm, less than about 30 ppm, or less than about 20 ppm.

The first quantum dots, the second quantum dots, and the third quantum dots may each independently include a core including a first semiconductor nanocrystal and a shell disposed on the core and including a second semiconductor nanocrystal having a different composition from the first semiconductor nanocrystal.

The first semiconductor nanocrystal and the second semiconductor nanocrystal are independently, Group II-VI compound, Group III-V compound, Group IV-VI compound, Group I-III-VI compound, Group I-II-IV-VI compound, or a combination thereof.

The Group II-VI compound may be a binary element compound of CdSe, CdTe, ZnS, ZnSe, ZnTe, ZnO, HgS, HgSe, HgTe, MgSe, MgS, or a combination thereof; a ternary element compound of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound of HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof. The Group II-VI compound may further include a Group III metal. The Group III-V compound may be a binary element compound of GaN, GaP, GaAs, GaSb, AlN, AlP, AlAs, AlSb, InN, InP, InAs, InSb, or a combination; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, or a combination thereof; or a combination thereof. The Group III-V compound may further include a Group II metal (e.g., InZnP). The Group IV-VI compound may be a binary element compound of SnS, SnSe, SnTe, PbS, PbSe, PbTe, or a combination thereof; a ternary element compound of SnSeS, SnSeTe, SnSTe, PbSeS, PbSeTe, PbSTe, SnPbS, SnPbSe, SnPbTe, or a combination thereof; a quaternary element compound of SnPbSSe, SnPbSeTe, SnPbSTe, or a combination thereof; or a combination thereof. Examples of the Group I-III-VI compound may include CuInSe$_2$, CuInS$_2$, CuInGaSe, and CuInGaS, but are not limited thereto. Examples of the Group I-II-IV-VI compound may include CuZnSnSe and CuZnSnS, but are not limited thereto. The Group IV element or compound may be a single element of Si, Ge, or a combination thereof; a binary element compound of SiC, SiGe, or a combination thereof.

The first semiconductor nanocrystal (or the core) may include indium, zinc, or a combination thereof. The first semiconductor nanocrystal (or the core) may include InP, InZnP, ZnSe, ZnSeTe, or a combination thereof. The second semiconductor nanocrystal (the shell) may include zinc and selenium, sulfur, or a combination thereof. The second semiconductor nanocrystal (the shell) may include ZnSe, ZnSeS, ZnTeS, ZnTeSe, ZnS, or a combination thereof. The shell may include a multi-layered shell having at least two layers. In the multi-layered shell, a layer (e.g., directly) on the core may include Zn, Se, and optionally S. The outermost layer of the shell may include zinc and sulfur.

The core and the shell may have an interface, and an element in the interface may have a concentration gradient wherein the concentration of the element of the shell decreases toward the core. The semiconductor nanocrystal may have a structure including one semiconductor nanocrystal core and a multi-layered shell surrounding the same. Herein, the multi-layered shell has at least two shells wherein each shell may have a single composition, an alloy, or a concentration gradient.

The shell material and the core material may have different energy bandgaps from each other. In an embodiment, the energy bandgap of the shell material may be greater than that of the core material. According to an embodiment, the energy bandgap of the shell material may be less than that of the core material. The quantum dots may have a multi-layered shell. In the multi-layered shell, the energy bandgap of the outer layer may be greater than the energy bandgap of the inner layer (i.e., the layer nearer to the core). In the multi-layered shell, the energy bandgap of the outer layer may be less than the energy bandgap of the inner layer.

The quantum dots may have sizes of greater than or equal to about 1 nm and less than or equal to about 100 nm. The sizes of the quantum dots may be diameters (or diameters calculated assuming spherical shapes from a two-dimensional electron microscope image in a non-spherical shaped particle). As used herein, the size may refer to an average size as well as a size of a single particle. The quantum dots may have sizes of greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, or greater than or equal to about 10 nm. The quantum dots may have sizes of less than or equal to about 50 nm, less than or equal to about 40 nm, less than or equal to about 30 nm, less than or equal to about 20 nm, less than or equal to about 15 nm, less than or equal to about 10 nm, less than or equal to about 9 nm, or less than or equal to about 8 nm. The shapes of the quantum dots are not particularly limited. In an embodiment, the shapes of the quantum dots may include spheres, polyhedrons, pyramids, multipods, squares, rectangular parallelepipeds, nanotubes, nano rods, nanowires, nanosheets, or a combination thereof, but is not limited to.

The first quantum dots, the second quantum dots, and the third quantum dots may be configured to emit light having the same color.

In the emission layer, the quantum dots may control an absorption/emission wavelength by adjusting a composition and a size thereof. A maximum peak emission wavelength of the quantum dot may be an ultraviolet (UV) to infrared wavelength or a wavelength of greater than the above wavelength range. In an embodiment, the maximum peak emission wavelength of the quantum dot may be greater than or equal to about, 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum peak emission wavelength of the quantum dot may be less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum peak emission wavelength of the quantum dots may be in the range of about 500 nm to about 650 nm. The maximum peak emission wavelength of the quantum dots may be in the range of about 500 nm to about 550 nm (green). The maximum peak emission wavelength of the quantum dots may be in the range of about 600 nm to about 650 nm (red). The maximum peak emission wavelength of the quantum dots may be in the range of greater than or equal to about 450 nm and less than or equal to about 480 nm (blue).

In an embodiment, the (e.g., $1^{st}$, $2^{nd}$, and $3^{rd}$) quantum dots in the emission layer may be configured to emit light having the same color. In an embodiment, the quantum dots in the emission layer 13 (i.e., in the first layer, in the second layer, or in the third layer) may be configured to emit light having the same color. In this case (i.e., of emitting the light having the same color), a difference between the center wavelengths of the ($1^{st}$, $2^{nd}$, and $3^{rd}$) quantum dots may be about 15 nm at maximum, for example, less than or equal to about 10 nm, and in this case, a full width at half maximum (FWHM) of light (e.g., electroluminescence peak) emitted from the emission layer may be less than or equal to about 60 nm, less than or equal to about 50 nm, less than or equal to about 40 nm, less than or equal to about 35 nm, less than or equal to about 30 nm, less than or equal to about 25 nm, or less than or equal to about 20 nm.

In another embodiment, the quantum dots in a given layer (e.g., the $1^{st}$ layer, the $2^{nd}$ layer, or the $3^{rd}$ layer) of the emission layer 13 may be configured to emit light having a different color from the quantum dots in other layer(s) of the emission layer 13. In an embodiment, the quantum dots in the $1^{st}$ layer of the emission layer 13 may have a maximum peak emission wavelength in a green (or red) range and the quantum dots in the $2^{nd}$ or $3^{rd}$ layer of the emission layer 13 may have a maximum peak emission wavelength in a red (or green) range or vice versa.

The quantum dots may have (electroluminescence or photoluminescence) quantum efficiency of greater than or equal to about 10%, for example, greater than or equal to about 30%, greater than or equal to about 50%, greater than or equal to about 60%, greater than or equal to about 70%, greater than or equal to about 90%, or even about 100%. The quantum dots may have a relatively narrow emission spectrum. A (electro- or photo-) emission spectrum of the quantum dots may have for example a full width at half maximum (FWHM) of less than or equal to about 50 nm, for example less than or equal to about 45 nm, less than or equal to about 40 nm, less than or equal to about 35 nm, or less than or equal to about 30 nm.

The first quantum dots, the second quantum dots, and the third quantum dots may not include organic thiol compounds bound to the surfaces (e.g., the following thiol-based organic compound or a salt thereof). The organic thiol compound may include butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutylmercaptoacetate, thioglycolic acid, 3-mercaptopropionic acid, thiopronine, 2-mercaptopropionic acid, 2-mercaptopropionate, 2-mercaptoethanol, cysteamine, 1-thioglycerol, mercaptosuccinic acid, L-cysteine, dihydrolipoic acid, 2-(dimethylamino)ethanethiol, 5-mercaptomethyltetrazole, 2,3-dimercapto-1-propanol, glutathione, m(PEG)-SH, dialkyldithiocarbamic acid or a metal salt thereof, or a combination thereof.

A thickness of each of the first layer, the second layer, and the third layer may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm. The thickness of each of the first layer, the second layer, and the third layer may be less than or equal to about 50 nm, less than or equal to about 40 nm, less than or equal to about 30 nm, or less than or equal to about 20 nm.

The thickness of each of the first layer, the second layer, and the third layer may be 1 monolayer or more, for example, 2 monolayers or more, 3 monolayers or more, or 4 monolayers or more. The thickness of each of the first layer, the second layer, and the third layer may be 10 monolayers or less, 9 monolayers or less, 8 monolayers or less, 7 monolayers or less, 6 monolayers or less, or 5 monolayers or less.

A thickness of the quantum dot emission layer may be greater than or equal to about 15 nm, greater than or equal to about 20 nm, greater than or equal to about 22 nm, greater than or equal to about 24 nm, greater than or equal to about 26 nm, greater than or equal to about 28 nm, greater than or equal to about 30 nm, greater than or equal to about 32 nm, greater than or equal to about 34 nm, or greater than or equal to about 35 nm. The thickness of the quantum dot emission layer may be less than or equal to about 100 nm, less than or equal to about 95 nm, less than or equal to about 90 nm, less than or equal to about 85 nm, less than or equal to about 80 nm, less than or equal to about 75 nm, less than or equal to about 70 nm, less than or equal to about 65 nm, less than or equal to about 60 nm, less than or equal to about 55 nm, less than or equal to about 50 nm, or less than or equal to about 45 nm.

However, a light emitting device according to an embodiment has an emission layer having the aforementioned structure and thus may show prolonged life-span characteristics as well as improved electroluminescence properties. Without being bound by any particular theory, the aforementioned structure of the light emitting device according to an embodiment may induce the light emitting region generated through an electron-hole recombination to be formed in the center of the emission layer (EML), and accordingly, the device may show improved properties. In a light emitting device according to an embodiment, the aforementioned quantum dot emission layer of a multi-layer structure may be formed by a method which will be described later.

The light emitting device according to an embodiment may include a charge auxiliary layer. The charge auxiliary layer may include an electron auxiliary layer, a hole auxiliary layer, or a combination thereof.

The hole auxiliary layer 12 may be disposed between the first electrode 11 (e.g., anode) and the emission layer 13. The hole auxiliary layer 12 may have one layer or two or more layers and may include, for example a hole injection layer, a hole transport layer, an electron blocking layer, or a combination thereof.

The hole auxiliary layer 12 may have a HOMO energy level so that it may match a HOMO energy level of the emission layer 13 and may enforce mobility of holes from the hole auxiliary layer 12 into the emission layer 13.

The HOMO energy level of the hole auxiliary layer 12 (e.g., hole transport layer (HTL)) contacting the emission layer may be the same as or less than the HOMO energy level of the emission layer 13 within a range of less than or equal to about 1.0 eV. In an embodiment, a difference of HOMO energy levels between the hole auxiliary layer 12 and the emission layer 13 may be greater than or equal to about 0 eV and less than or equal to about 1.0 eV.

The HOMO energy level of the hole auxiliary layer 12 may be, for example, greater than or equal to about 5.0 eV, greater than or equal to about 5.2 eV, or greater than or equal to about 5.3 eV. The HOMO energy level of the hole auxiliary layer 12 may be less than or equal to about 6.2 eV, for example, about 6.1 eV, less than or equal to about 6.0 eV, less than or equal to about 5.9 eV, less than or equal to about 5.8 eV, or less than or equal to about 5.6 eV.

The LUMO energy level of the hole auxiliary layer 12 may be, for example, greater than or equal to about 2.1 eV, greater than or equal to about for example, about 2.2 eV, or greater than or equal to about 2.3 eV. The LUMO energy level of the hole auxiliary layer 12 may be less than or equal to about 3 eV, for example, less than or equal to about 2.9 eV, or less than or equal to about 2.8 eV.

In an embodiment, the hole auxiliary layer 12 may include a hole injection layer near to the first electrode 11 and a hole transport layer near to the emission layer 13.

A material included in the hole auxiliary layer 12 (e.g., hole transport layer or hole injection layer) is not particularly limited and may include for example poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene)polystyrene sulfonate (PEDOT:PSS), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), 4,4',4"-tris[phenyl(m-tolyl)amino]triphenylamine (m-MTDATA), 4,4',4"-tris(N-carbazolyl)-triphenylamine (TCTA), 1,1-bis[(di-4-tolyl amino)phenylcyclohexane (TAPC), diipyrazino[2,3-f:2',3'-h]quinoxaline-2,3,6,7,10,11-hexacarbonitrile (HAT-CN), a p-type metal oxide (e.g., NiO, $WO_3$, $MoO_3$, etc.), a carbon-based material such as a graphene oxide, or a combination thereof, but is not limited thereto.

In the hole auxiliary layer(s), a thickness of each layer may be appropriately selected. In an embodiment, the thickness of each layer may be greater than or equal to about 10 nm, for example, greater than or equal to about 15 nm, greater than or equal to about 20 nm, and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

The electron auxiliary layer 14 may be disposed between the emission layer 13 and the second electrode 15 (e.g., cathode). The electron auxiliary layer 14 may include for example an electron injection layer, an electron transport layer, a hole blocking layer, or a combination thereof, but is not limited thereto. In an embodiment, the electron auxiliary layer 14 may include an electron transport layer.

The electron transport layer, the electron injection layer, or a combination thereof may include for example 1,4,5,8-naphthalene-tetracarboxylic dianhydride (NTCDA), bathocuproine (BCP), tris[3-(3-pyridyl)-mesityl]borane (3TP-YMB), LiF, tris(8-hydroxyquinolinato) aluminum ($Alq_3$), tris(8-hydroxyquinoline) gallium ($Gaq_3$), tris(8-hydroxyquinolinato) indium ($Inq_3$), zinc (ii)-bis(8-hydroxyquinoline) ($Znq_2$), bis(2-(2-hydroxyphenyl)benzothiazolate) zinc (II), ($Zn(BTZ)_2$), bis(10-hydroxybenzo[h]quinolinato)beryllium ($BeBq_2$), 8-(4-(4,6-di(naphthalen-2-yl)-1,3,5-triazin-2-yl) phenyl)quinolone (ET204), 8-hydroxyquinolinato lithium (Liq), n-type metal oxide (e.g., ZnO, $HfO_2$, etc.), or a combination thereof, but is not limited thereto. The hole blocking layer (HBL) may include for example 1,4,5,8-naphthalene-tetracarboxylic dianhydride (NTCDA), bathocuproine (BCP), tris[3-(3-pyridyl)-mesityl] borane (3TP-YMB), LiF, $Alq_3$, $Gaq_3$, $Inq_3$, $Znq_2$, $Zn(BTZ)_2$, $BeBq_2$, or a combination thereof, but is not limited thereto.

In an embodiment, the electron auxiliary layer 14 (e.g., electron transport layer) includes a plurality of nanoparticles. The nanoparticles include a metal oxide including zinc.

The metal oxide may include $Zn_{1-x}M_xO$ (wherein M is Mg, Ca, Zr, W, Li, Ti, or a combination thereof, and 0≤x≤0.5). In an embodiment, in Chemical Formula 1, M may be magnesium (Mg). In an embodiment, in Chemical Formula 1, x may be greater than or equal to about 0.01 and less than or equal to about 0.3, for example, less than or equal to about 0.25, less than or equal to about 0.2, or less than or equal to about 0.15.

The metal oxide may include zinc oxide, zinc magnesium oxide, or a combination thereof. An absolute value of LUMO of quantum dots included in the emission layer may be less than an absolute value of LUMO of the metal oxide. In an embodiment, an absolute value of LUMO of quantum dots may be larger than an absolute value of LUMO of a metal oxide electron transport layer (ETL). An absolute value of LUMO of blue QD may be less than an absolute value of LUMO of a metal oxide ETL. Electron injection in an electroluminescent device including blue QD may be different from a light emitting device including red or green quantum dots.

An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may not have a rod shape. The nanoparticles may not have a nano wire shape.

In an embodiment, each thickness of the electron auxiliary layer 14 (e.g., an electron injection layer, an electron transport layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, or less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

A device according to an embodiment may have a normal structure. In an embodiment, in the device, an anode 10 disposed on a transparent substrate 100 may include a metal oxide-based transparent electrode (e.g., ITO electrode) and a cathode 50 facing the anode 10 may include a conductive metal (e.g., Mg, Al Ag, or a combination thereof) (e.g., having a relatively low work function). A hole auxiliary layer 20 (e.g., a hole injection layer of PEDOT:PSS, p-type metal oxide, or a combination thereof; a hole transport layer of TFB, PVK, or a combination thereof; or a combination thereof) may be disposed between the transparent electrode 10 and the quantum dot (QD) emission layer 30. The hole injection layer may be near to the transparent electrode and the hole transport layer may be near to the emission layer. An electron auxiliary layer 40 such as an electron injection layer/a transport layer may be disposed between the quantum dot emission layer 30 and the cathode 50. (refer to FIG. 2) A device according to an embodiment may have an inverted structure.

Figure 3:
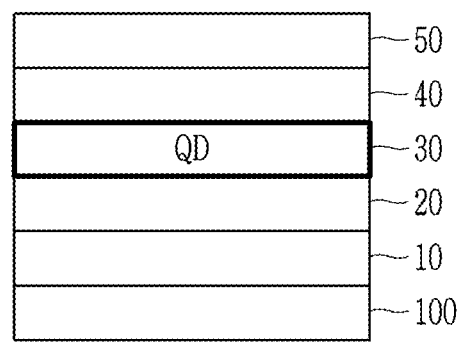
FIG. 3 is a schematic cross-sectional view of a QD LED device (normal structure) according to an embodiment.
Figure 4:
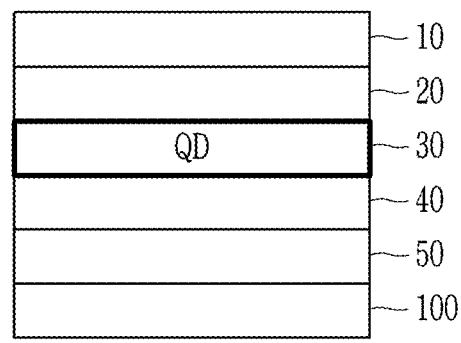
FIG. 4 is a schematic cross-sectional view of a QD LED device (inverted structure) according to an embodiment.

A cathode 50 disposed on the transparent substrate 100 may include a metal oxide-based transparent electrode (e.g., ITO) and an anode 10 facing the cathode may include a metal (e.g., Au, Ag, Al Mg, or a combination thereof) (e.g., having a relatively high work function). In an embodiment, (optionally doped) n-type metal oxide (crystalline Zn metal oxide) may be disposed between the transparent electrode 50 and the emission layer 30 as an electron auxiliary layer (e.g., electron transport layer) 40. MoO₃ or other p-type metal oxides may be disposed between the metal anode 10 and the quantum dot emission layer 30 as a hole auxiliary layer 20 (e.g., a hole transport layer including TFB; a hole injection layer including PVK, MoO₃ or other p-type metal oxides, or a combination thereof; or a combination thereof). (refer to FIG. 3)

The light emitting device of an embodiment may include a polymer layer (e.g., directly) disposed on the second electrode (or if present, the charge auxiliary layer). The polymer layer may encapsulate the entire device (e.g., as a whole).

The polymer layer may include a polymerization product of a monomer combination including unsaturated compounds having at least two carbon-carbon unsaturated bonds. The monomer combination may further include a multiple thiol compound having at least two thiol groups, a monothiol compound having one thiol group, or a combination thereof. The polymer layer may include a polymerization product of a monomer combination including a thiol compound having at least one (e.g., at least two) thiol group (e.g., multiple thiol compound) and an unsaturated compound having at least two carbon-carbon unsaturated bonds.

The unsaturated compound may include a di(meth)acrylate compound, a tri(meth)acrylate compound, a tetra(meth) acrylate compound, a penta(meth)acrylate compound, a hexa(meth)acrylate compound, or a combination thereof. The unsaturated compound may not include a carboxylic acid group.

The unsaturated compound may include a center moiety and at least two X'—R—* bound to the center moiety, wherein X' is a moiety including a carbon-carbon unsaturated bond, for example, a double bond, R is a substituted or unsubstituted C1 to C30 aliphatic hydrocarbon group or a substituted or unsubstituted C1 to C30 aliphatic hydrocarbon group in which at least one methylene is replaced by sulfonyl, carbonyl, ether, sulfide, sulfoxide, ester, amide, or a combination thereof, and * is a linking portion with the center moiety. The center moiety may include a carbon atom, a substituted or unsubstituted C1 to C30 aliphatic hydrocarbon group, a substituted or unsubstituted C3 to C30 alicyclic hydrocarbon group, a substituted or unsubstituted C6 to C30 aromatic hydrocarbon group, a substituted or unsubstituted C3 to C30 heteroarylene group, a substituted or unsubstituted C3 to C30 heterocyclic group, or a combination thereof. The center moiety may include a triazine moiety, a triazinetrione moiety, quinoline moiety, a quinolone moiety, a naphthalene moiety, or a combination thereof.

The unsaturated compound may be compounds represented by Chemical Formulae 2-1 and 2-2.

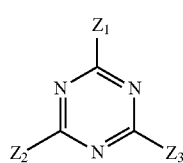

Chemical Formula 2-1

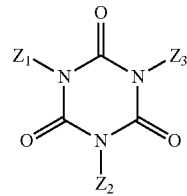

Chemical Formula 2-2

In the chemical formulae, $Z_1$ to $Z_3$ are independently the moiety represented by X'—R—*.

The multiple thiol compound may include a dimercaptoacetate compound, a trimercaptoacetate compound, a tetramercaptoacetate compound, a dimercaptopropionate compound, a trimercapto propionate compound, a tetramercaptopropionate compound, an isocyanate compound including at least two mercaptoalkyl carbonyloxyalkyl groups, an isocyanurate compound including at least two mercaptoalkyl carbonyloxyalkyl groups, or a combination thereof.

An embodiment provides a method of manufacturing the aforementioned light emitting device. The manufacturing method may include forming an emission layer on a first electrode; and forming a second electrode on the emission layer, wherein the forming of the emission layer includes forming a first layer including first quantum dots and having a first HOMO energy level on the first electrode, forming a third layer including third quantum dots and having a third HOMO energy level on the first layer, and forming a second layer including second quantum dots and having a second HOMO energy level on the third layer, wherein the third HOMO energy level is less than the first HOMO energy level and the third HOMO energy level is less than the second HOMO energy level.

The method may further include forming a charge auxiliary layer (e.g., a hole injection layer, a hole transport layer, or a combination thereof) on the first electrode before forming of the emission layer. The method may further include forming a charge auxiliary layer (e.g., an electron transport layer, an electron injection layer, or a combination thereof) on the emission layer before forming of the second electrode.

The forming of the first layer may include surface-treating quantum dots having organic ligands on the surfaces with a metal halide to obtain the first quantum dots. Details of the quantum dots and the organic ligands are the same as described above.

In an embodiment, the surface-treating with the metal halide may include dispersing the quantum dots having organic ligands on the surfaces in a first organic solvent to form quantum dot organic dispersion; dissolving the metal halide in a polar (organic) solvent that is miscible with the first organic solvent to obtain a metal halide solution; mixing the quantum dot organic dispersion and the metal halide solution to obtain a mixture; and stirring the mixture at a temperature of greater than or equal to about 45° C. and less than or equal to about 150° C.

The obtained first quantum dots may be dispersed in an organic solvent to form an organic solution, and the organic solution may be applied on a first electrode (or a charge auxiliary layer) to form the first layer.

A volume ratio of the polar organic solvent relative to the first organic solvent may be less than or equal to about 0.1:1, less than or equal to about 0.09:1, less than or equal to about 0.08:1, or less than or equal to about 0.07:1 and greater than or equal to about 0.001:1, greater than or equal to about 0.01, greater than or equal to about 0.02:1, greater than or equal to about 0.03:1, greater than or equal to about 0.04:1, or greater than or equal to about 0.05:1.

The metal halide may include zinc, indium, gallium, magnesium, lithium, or a combination thereof. The metal halide may include zinc chloride, indium chloride, or a combination thereof.

The first organic solvent may include a substituted or unsubstituted C5 to C40 aliphatic hydrocarbon group, a substituted or unsubstituted C6 to C40 aromatic hydrocarbon group, a substituted or unsubstituted C3 to C40 alicyclic hydrocarbon group, or a combination thereof. The polar organic solvent may include C1 to C10 alcohol, or a combination thereof. In an embodiment, the polar solvent may include, for example, methanol, ethanol, propanol, isopropanol, butanol, pentenol, hexanol, heptanol, or a combination thereof.

By such a surface exchange treatment, quantum dots (e.g., first quantum dots) including the organic ligand and the metal halide (e.g., bound thereto) on the surfaces may be obtained. The amount of the organic ligand in the obtained quantum dots may be less than or equal to about 10 wt %, based on a total weight of the quantum dots. The obtained quantum dots include a halogen, and the amount of the halogen may be greater than or equal to about 1 microgram (μg) and less than or equal to about 30 μg per 1 milligram (mg) of the quantum dot. The obtained quantum dots may be dispersed in an organic solvent to form an organic solution, and the obtained quantum dot organic dispersion may be applied on a first electrode (or, if present, a charge auxiliary layer) to obtain a first layer.

In an embodiment, the surface-treating with the metal halide may be performed by forming a film of quantum dots having organic ligands on the surfaces, contacting the obtained quantum dot film with a metal halide solution including a metal halide in a polar (organic) solvent, optionally, removing the metal halide solution from the film, and drying the treated film. In this case, the first layer may be obtained by an additional applying process. Details of the quantum dot organic dispersion, polar (organic) solvent and metal halide are described as above.

A concentration of the metal halide solution may be greater than or equal to about 0.001 grams per liter (g/L), for example, greater than or equal to about 0.01 g/L, greater than or equal to about 0.05 g/L, greater than or equal to about 0.1 g/L, greater than or equal to about 0.5 g/L, greater than or equal to about 1 g/L, greater than or equal to about 10 g/L, greater than or equal to about 50 g/L, greater than or equal to about 60 g/L, greater than or equal to about 70 g/L, greater than or equal to about 80 g/L, or greater than or equal to about 90 g/L and less than or equal to about 1000 g/L, for example, less than or equal to about 500 g/L, less than or equal to about 400 g/L, less than or equal to about 300 g/L, less than or equal to about 200 g/L, less than or equal to about 100 g/L, less than or equal to about 90 g/L, less than or equal to about 80 g/L, less than or equal to about 70 g/L, less than or equal to about 60 g/L, less than or equal to about 50 g/L, less than or equal to about 40 g/L, less than or equal to about 30 g/L, less than or equal to about 20 g/L, less than or equal to about 10 g/L, less than or equal to about 1 g/L, or less than or equal to about 0.5 g/L.

The contacting the metal halide solution with the formed quantum dot film may include adding the metal halide solution to the film in a dropwise fashion, and applying (e.g., coating or spin coating). By the metal halide treatment as above, the first layer may exhibit changed solubility, and even if the quantum dot organic dispersion is applied or deposited on the first layer, the first layer may not be substantially changed. Thus, the quantum dot organic dispersion may be applied or deposited on the spin-dried treated first layer to form a quantum dot layer (e.g., a third layer). The quantum dot organic dispersion may be obtained by dispersing quantum dots at a desired concentration in an organic solvent (e.g., the aforementioned organic solvent) capable of dispersing the quantum dots. The applying or depositing may be carried out in an appropriate manner (e.g., by spin coating, inkjet printing, etc.). The applied or deposited quantum dot layer may be annealed (e.g., to remove the solvent) as desired. An annealing temperature is not particularly limited, and may be appropriately selected taking into consideration a boiling point of the organic solvent. In an embodiment, the annealing temperature may be greater than or equal to about 60° C., for example, greater than or equal to about 65° C., greater than or equal to about 70° C., or greater than or equal to about 75° C. and less than or equal to about 100° C., for example, less than or equal to about 95° C., less than or equal to about 90° C., less than or equal to about 85° C., or less than or equal to about 80° C. An annealing time may be selected appropriately. In an embodiment, the annealing time may be for example, greater than or equal to about 10 minutes, for example, greater than or equal to about 30 minutes.

The forming the second layer on the third layer may include surface-treating quantum dots having organic ligands on the surfaces with a metal halide to obtain second quantum dots. The surface-treating with the metal halide may refer to the process of forming the first layer. The obtained second quantum dots may be dispersed in an organic solvent to form an organic solution, and this organic solution may be applied on the third layer to form the second layer.

It may not be easy to obtain an emission layer of a multi-layer structure by applying multiple coatings of dispersion of quantum dots including the same type of organic ligands. This is because the solvent of quantum dot dispersion for coating may dissolve the previously coated QD layer. In an embodiment, the film formation process may be performed more easily because surface properties of the third quantum dots constituting the third layer are different from surface properties of the quantum dots of the second quantum constituting the second layer.

On the formed second layer (e.g., a charge auxiliary layer such as an electron auxiliary layer) an electrode (e.g., cathode) may be optionally formed. The charge auxiliary layer (e.g., electron auxiliary layer) may be formed by an appropriate method (e.g., spin coating or deposition) taking into consideration a material, a thickness, and the like of the charge auxiliary layer.

In an embodiment, since the formed second layer may not be dissolved in an alcohol solvent, when an electron transport layer is formed based on the aforementioned zinc-containing metal oxide nanoparticles, nanoparticles dispersed in the alcohol solvent may be formed on the aforementioned emission layer.

The method of forming the electrode and the charge auxiliary layer are not particularly limited and may be appropriately selected taking into consideration materials of the electrode and the charge auxiliary layer. The forming of the electrode and charge auxiliary layer may be performed by a solution process, a deposition process, or a combination thereof.

In a method according to an embodiment, the electron auxiliary layer is formed and then a second electrode is formed. On the formed second electrode, a polymer layer may be added as desired. Details of the polymer layer are described as above. In a method according to an embodiment, the light emitting device in which the polymer layer is formed may be heated to a suitable temperature (e.g., at a temperature of greater than or equal to about 50° C.). The heating may be performed under an inert atmosphere (e.g., an oxygen-free atmosphere, argon, nitrogen, or other inert gas atmospheres).

An embodiment provides an electronic device including the aforementioned light emitting device. The electronic device may be applied to, e.g., used in, various electronic devices such as display devices or lighting devices.

In an embodiment, the emission layer includes a first layer including first quantum dots, a second layer including second quantum dots, and a third layer including third quantum dots and disposed between the first layer and the second layer, wherein an amount ratio of carbon relative to zinc in the third layer may be greater than an amount ratio of carbon relative to zinc in the first layer or the second layer; and an amount ratio of a halogen relative to zinc in the third layer is less than an amount ratio of a halogen relative to zinc in the first layer or the second layer. The amount ratio may be a molar ratio or a weight ratio. The first layer may have a first HOMO energy level, the second layer may have a second HOMO energy level, and the third layer may have a third HOMO energy level, wherein the third HOMO energy level may be lower than the first HOMO energy level and the second HOMO energy level.

Details of the first layer, the second layer, and the third layer are described as above. The emission layer may also be used as active layers in quantum dot color converters and quantum dot optoelectronic devices.

Hereinafter, the embodiments are illustrated in more detail with reference to examples. However, these examples are exemplary, and the present scope is not limited thereto.

Analysis Methods

1. Highest Occupied Molecular Orbital (HOMO) Level Measurement

The HOMO is measured using ultraviolet photoemission spectroscopy (UPS) or an AC-3 instrument.

2. Electroluminescence Spectroscopy

Electroluminescent properties of the obtained quantum dot light emitting device are evaluated using a Keithley 2200 source measuring device and a Minolta CS2000 spectroradiometer (current-voltage-luminance measurement equipment). A current depending upon a voltage applied to the device, luminance, and electroluminescence (EL) are measured by the current-voltage-luminance measurement equipment, and thereby external quantum efficiency is calculated.

3. Life-Span Characteristics

T50(h): On driving at 100 nits, a time (hours (hr)) required for luminance to become 50% of the initial luminance of 100% is measured.

T95(h): On driving at 100 nits, a time (hr) required for luminance to become 95% of the initial luminance of 100% is measured.

Synthesis of Quantum Dots

Reference Example 1: Preparation of Blue Light Emitting Quantum Dot (1) Selenium (Se) and tellurium (Te) are dispersed in trioctylphosphine (TOP) to obtain a Se/TOP stock solution and a Te/TOP stock solution. 0.125 millimoles (mmol) of zinc acetate is added along with oleic acid (OA) to a reactor including trioctylamine and vacuum-treated at 120° C. After 1 hour, an atmosphere in the reactor is converted to nitrogen.

Subsequently, the reactor is heated up to 300° C., the prepared Se/TOP stock solution and Te/TOP stock solution are rapidly injected thereinto in a Te/Se ratio of 1/25. When the reaction is complete, acetone is added to the reaction solution that is rapidly cooled into room temperature, and a precipitate obtained by centrifugation is dispersed in toluene to obtain a ZnTeSe quantum dot.

(2) 1.8 mmoL (0.336 grams (g)) of zinc acetate is added along with oleic acid to a flask including trioctylamine and vacuum-treated at 120° C. for 10 minutes. The flask is substituted with nitrogen ($N_2$) and a temperature is increased up to 180° C. The ZnTeSe core obtained in Synthesis Example 1 is added and Se/TOP and S/TOP are injected. The reaction temperature is set to be about 280° C. After the reaction is complete, the reactor is cooled, and the prepared nanocrystal is centrifuged with ethanol and is dispersed in toluene to obtain a ZnTeSe/ZnSeS core/shell quantum dot.

Synthesis of Metal Oxide Nanoparticles

Reference Example 2: Synthesis of Zn Metal Oxide Nanoparticles

Zinc acetate dihydrate and magnesium acetate tetrahydrate so that a mole ratio in the following chemical formula may be provided are put in a reactor containing dimethylsulfoxide and heated at 60° C. in the air. Subsequently, an ethanol solution of tetramethylammonium hydroxide pentahydrate is added thereto in a dropwise fashion at a speed of 3 milliliters (mL)/minute (min). After stirring for one hour, the prepared $Zn_xMg_{1-x}O$ nanoparticles are centrifuged and dispersed in ethanol to obtain the $Zn_xMg_{1-x}O$ nanoparticles. (x=0.85)

An X-ray diffraction analysis with respect to the obtained nanoparticles is performed to confirm that ZnO crystals are formed. A transmission electron microscopic analysis with respect to the obtained nanoparticles is performed, and as a result, the particles have an average size of about 3 nanometers (nm).

Energy bandgaps of the obtained nanoparticles are measured and monitored by an ultraviolet (UV) band edge tangent line (UV-2600, SHIMADZU). The results show that the synthesized $Zn_xMg_{1-x}O$ has an energy bandgap of about 3.52 electronvolts (eV) to 3.70 eV.

Spin-Dry Treatment

Reference Example 3

A solution prepared by dissolving zinc chloride in ethanol (a concentration: 1 g/10 mL) is added in a dropwise fashion on the quantum dot layer, allowed to stand for one minute, partially removed with a spin-coater, three times washed with ethanol, and is dried on an 80° C. hot plate for 20 minutes. Hereinafter, this process is referred to as spin-dry process.

Preparation of Quantum Dots Surface-Substituted with Metal Halide

Reference Examples 4-1 to 4-4

The quantum dots prepared in Reference Example 1 are dispersed in toluene to obtain quantum dot organic dispersion. Zinc chloride is dissolved in ethanol to obtain a zinc chloride solution having a concentration of 10 weight percent (wt %). 0.01 mL of the obtained zinc chloride solution is added to the prepared quantum dot organic dispersion and then, stirred at 60° C. for 30 minutes to perform a surface exchange reaction. After the reaction, ethanol is added thereto to induce a precipitation, and the quantum dots are recovered through centrifugation. With respect to the recovered quantum dots, the surface exchange reaction is once repeated. A photoluminescence analysis, a thermogravimetric analysis, and an ion chromatography analysis with respect to the prepared quantum dots are performed, and the results are summarized in Table 1.

The prepared quantum dots are dispersed in toluene, and whether aggregated or not is examined by using dynamic light scattering (DLS). As a result, there is no substantial aggregation.

A DLS analysis is performed with respect to the surface-treated quantum dots, and the results are summarized in Table 1.

TABLE 1

| Samples | Quantum Yield (QY) (%) | Peak (nm) | Cl µg/1 milligram (mg) Quantum Dot (QD) | Oleic Acid (wt %) | Solvent dispersibility | DLS analysis result (particle average (avg.) sizes and standard deviation (σ)) |
|---|---|---|---|---|---|---|
| Reference Example 1 | 62 | 453 | — | 10.2 | No aggregation | — |
| Reference Example 4-1 | 82 | 454 | 8.3 | 7.0 | No aggregation | Avg. size: 19.7 nm, σ 6.2 |
| Reference Example 4-2 | 83 | 455 | 11.4 | 5.7 | No aggregation | — |
| Reference Example 4-3 | 80 | 455 | 19.0 | 5.1 | No aggregation | — |
| Reference Example 4-4 | 73 | 455 | 40.6 | 4.2 | Aggregation occurs | Avg. size: 376 nm, σ 317 |

Referring to the results of Table 1, the quantum dots of Reference Examples 4-1 to 4-3 exhibit improved properties and proper amounts of organic material (e.g., oleic acid) and halogen compared with properties and amounts of organic material and halogen of the quantum dots of Reference Examples 1 and 4-4. Through the solvent dispersion experiment and the DLS analysis, the quantum dots of Reference Examples 4-1 to 4-3 maintain dispersibility without aggregation, but the quantum dots of Reference Example 4-4 exhibit aggregations in an organic solvent.

Manufacture of Devices

Example 1

A device of indium tin oxide (ITO)/poly(3,4-ethylenedioxythiophene)polystyrene sulfonate (PEDOT:PSS) (30 nm)/poly(9,9-dioctyl-fluorene-co-N-(4-butylphenyl)-diphenylamine) (TFB) (25 nm)/QD emission layer/ZnMgO (20 nm)/Al 100 (nm) is manufactured in the following method.

ITO (an anode) is deposited on a substrate, and a PEDOT:PSS layer and a TFB layer as a hole injection layer (HIL) and a hole transport layer (HTL) are respectively formed thereon in a wet coating method. Octane dispersion of the core shell quantum dots according to Reference Example 1 is spin-coated and then, heat-treated at 80° C. for 30 minutes to form a quantum dot layer. The formed quantum dot layer is spin-dried to obtain a first layer (a thickness: 20 nm). With respect to the first layer, a HOMO level is measured using an AC-3 instrument. The measured HOMO energy level is 6.0 eV.

On the first layer, the octane dispersion of the core/shell quantum dots according to Reference Example 1 is spin-coated and heat-treated at 80° C. for 30 minutes to form a third layer (a thickness: 12 nm). With respect to the formed third layer, a HOMO level is measured using an AC-3 instrument. The measured HOMO energy level is 5.5 eV.

On the third layer, octane dispersion of the core/shell quantum dots according to Reference Example 3-2 is spin-coated and heat-treated at 80° C. for 30 minutes to form a second layer (a thickness: 12 nm). With respect to the formed third layer, an HOMO level is measured using an AC-3 instrument. The measured HOMO energy level is 5.8 eV.

A solution of the ZnMgO nanoparticles according to Reference Example 2 (a solvent: ethanol) is prepared. The prepared solution is spin-coated on the emission layer and heat-treated at 80° C. for 30 minutes to form an electron auxiliary layer (20 nm). On the formed electron auxiliary layer, an Al electrode (a cathode, 100 nm) is deposited.

0.1 g of a monomer mixture including an ene monomer having two acrylates and an alicyclic center moiety and a multiple thiol compound represented by the following formula in a mole ratio of 22:78 is prepared.

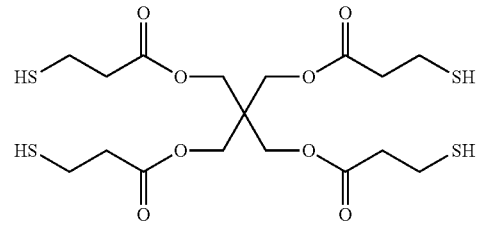 [SMILES: O=C(CCS)OCC(COC(=O)CCS)(COC(=O)CCS)COC(=O)CCS]

The prepared mixture is coated on the surface of the aluminum electrode and the electron transport layer (ETL) of the device to form a polymer precursor layer. A cover glass is disposed on the polymer precursor layer and pressed, and then, the monomer mixture is polymerized for 5 minutes in a state of being heated up by radiating UV light (a wavelength: 365 nm, intensity: 600 millijoules per square centimeter ($mJ/cm^2$)) into the device having the polymer precursor layer to obtain the light emitting device having a polymer layer.

Electroluminescence properties and life-span characteristics of the manufactured device are summarized in Table 2.

Comparative Example 1

An electroluminescent device is manufactured according to the same method as Example 1 except that octane dispersion of the core/shell quantum dots according to Reference Example 1-2 is spin-coated and heat treated at 80° C. for 30 minutes to form an emission layer (a thickness: 32 nm). Electroluminescence properties and life-span characteristics of the manufactured device are summarized in Table 2.

Comparative Example 2

An electroluminescent device is manufactured according to the same method as Example 1 except that octane dispersion of the core/shell quantum dots according to Reference Example 1-2 is spin-coated, heat treated at 80° C. for 30 minutes, and spin-dried to form an emission layer (a thickness: 40 nm). Electroluminescence properties and life-span characteristics of the manufactured device are shown in Table 2.

TABLE 2

| Description | Max. EQE (%) | EQE @ 100 nits (%) | Max. Cd/A | Candelas per square meter (Cd/m$^2$) @ 5 milliamperes (mA) | Lambda max. (nm) | Max. Lum. (Cd/m$^2$) | T95 (hours) | T50 (hours) |
|---|---|---|---|---|---|---|---|---|
| Example 1 | 13.4 | 8.2 | 9.8 | 479 | 458 | 22,310 | 6.61 | 46 |
| Comparative Example 1 | 12.8 | 6.6 | 7.8 | 370 | 455 | 20,050 | 1.16 | 13.4 |
| Comparative Example 2 | 5.0 | 5.0 | 4.4 | 213 | 458 | 11,840 | 1.84 | 17.9 |

* Max. EQE: maximum external quantum efficiency
* EQE @ 100 nits: external quantum efficiency at luminance of 100 nits (candelas per square meter)
* Max. candelas per ampere (Cd/A): maximum current efficiency
* Lambda max.: maximum emission wavelength
* Max. Lum.: maximum luminance Referring to the results of Table 2, the light emitting device of Example 1 may exhibit improved life-span characteristics as well as have improved electroluminescence properties compared with life-span characteristics and electroluminescence properties of the light emitting devices according to Comparative Examples 1 and 2.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: light emitting device
11: first electrode
12: hole auxiliary layer
13: emission layer
14: electron auxiliary layer
15: second electrode

What is claimed is:

1. An electroluminescent device, comprising
a first electrode and a second electrode facing each other,
a quantum dot emission layer disposed between the first electrode and the second electrode
wherein the quantum dot emission layer does not comprise cadmium, lead, or a combination thereof,
wherein the quantum dot emission layer comprises
a first layer comprising first quantum dots, the first layer facing the first electrode,
a second layer comprising second quantum dots, the second layer facing the second electrode, and
a third layer comprising third quantum dots, the third layer disposed between the first layer and the second layer,
wherein a highest occupied molecular orbital energy level of the third layer is less than a highest occupied molecular orbital energy level of the first layer, and
wherein the highest occupied molecular orbital energy level of the third layer energy level is less than a highest occupied molecular orbital energy level of the second layer.

2. The electroluminescent device of claim 1, wherein the first layer and the third layer are adjacent to each other and the third layer and the second layer are adjacent to each other.

3. The electroluminescent device of claim 1, wherein a difference between the highest occupied molecular orbital energy level of the third layer and the highest occupied molecular orbital energy level of the first layer is greater than or equal to about 0.2 electronvolts (eV).

4. The electroluminescent device of claim 1, wherein a difference between the highest occupied molecular orbital energy level of the third layer and the highest occupied molecular orbital energy level of the second layer is greater than or equal to about 0.2 electronvolts.

5. The electroluminescent device of claim 1, wherein
the first quantum dots, the second quantum dots, and the third quantum dots have a same or different composition and
each independently comprise
a core comprising a first semiconductor nanocrystal and a shell disposed on the core and comprising a second semiconductor nanocrystal having a different composition from the first semiconductor nanocrystal.

6. The electroluminescent device of claim 5, wherein the first semiconductor nanocrystal and the second semiconductor nanocrystal independently comprise a Group II-VI compound, a Group III-V compound, a Group IV-VI compound, a Group I-III-VI compound, a Group I-II-IV-VI compound, or a combination thereof.

7. The electroluminescent device of claim 1, wherein the first quantum dots, the second quantum dots, and the third quantum dots are configured to emit light having a same color.

8. The electroluminescent device of claim 1, wherein the first quantum dots, the second quantum dots, and the third quantum dots do not comprise an organic thiol compound bound to a surface thereof.

9. The electroluminescent device of claim 1, wherein the first quantum dots and the second quantum dots comprise a halide and an organic ligand on a surface thereof.

10. The electroluminescent device of claim 9, wherein the organic ligand comprises RCOOH, $RNH_2$, $R_2NH$, $R_3N$, $R_3PO$, $R_3P$, ROH, RCOOR, $RPO(OH)_2$, RHPOOH, $R_2POOH$, or a combination thereof, wherein each R is independently a C3 to C40 substituted or unsubstituted aliphatic hydrocarbon group, a C6 to C40 substituted or unsubstituted aromatic hydrocarbon group, or a combination thereof.

11. The electroluminescent device of claim 10, wherein
the organic ligand comprises a C6 to C30 aliphatic carboxylic acid compound, and
the halide comprises a chloride.

12. The electroluminescent device of claim 1, wherein an amount ratio of carbon relative to zinc present in the first layer or the second layer is less than an amount ratio of carbon relative to zinc present in the third layer, according to X-ray photoelectron spectroscopy.

13. The electroluminescent device of claim 1, wherein an amount of halogen present in the third layer is less than an amount of halogen present in the first layer or the second layer, according to X-ray photoelectron spectroscopy.

14. The electroluminescent device of claim 1, wherein the third quantum dots comprise an organic ligand on a surface thereof and do not comprise a halogen.

15. The electroluminescent device of claim 14, wherein the organic ligand comprises a C6 to C30 aliphatic carboxylic acid compound.

16. The electroluminescent device of claim 1, wherein a thickness of the first layer is greater than or equal to about 5 nanometers and less than or equal to about 40 nanometers.

17. The electroluminescent device of claim 1, wherein a thickness of the quantum dot emission layer is greater than or equal to about 15 nanometers and less than or equal to about 100 nanometers.

18. The electroluminescent device of claim 1, further comprising a first charge auxiliary layer adjacent to the first layer, a second charge auxiliary layer adjacent to the second layer, or a combination thereof.

19. A method of manufacturing the electroluminescent device of claim 1, comprising
forming the quantum dot emission layer on the first electrode; and
forming the second electrode on the quantum dot emission layer,
wherein the forming of the quantum dot emission layer comprises
forming the first layer comprising first quantum dots on the first electrode,
forming the third layer comprising third quantum dots on the first layer, and
forming the second layer comprising second quantum dots on the third layer.

20. A display device comprising the light emitting device of claim 1.

* * * * *